United States Patent [19]
Camerlo

[11] Patent Number: 6,157,251
[45] Date of Patent: Dec. 5, 2000

[54] METHOD AND APPARATUS FOR CLOCK UNCERTAINTY MINIMIZATION

[75] Inventor: Sergio D. Camerlo, Cupertino, Calif.

[73] Assignee: Cisco Technology, Inc., San Jose, Calif.

[21] Appl. No.: 09/439,918

[22] Filed: Nov. 12, 1999

Related U.S. Application Data

[62] Division of application No. 09/106,823, Jun. 29, 1998, Pat. No. 6,052,012.

[51] Int. Cl.[7] .................................................. H01L 25/00
[52] U.S. Cl. ............................................ 327/565; 327/292
[58] Field of Search ..................................... 327/291, 292, 327/564, 565, 566

[56] References Cited

U.S. PATENT DOCUMENTS 5,557,235  9/1996  Koike ...................................... 327/564
5,717,359  2/1998  Matsui et al. ........................... 327/565

*Primary Examiner*—Jeffrey Zweizig
*Attorney, Agent, or Firm*—D'Alessandro & Ritchie

[57] ABSTRACT

A method and apparatus for drastically reducing timing uncertainties in clocked digital circuits simply, at virtually no cost, and using only standard clock drivers and simple, inexpensive electrical components is described. The method includes the steps of minimizing timing uncertainties by controlling both clock skew and clock jitter. Intrinsic clock skew is eliminated by ganging the outputs of a multi-line clock together onto a capacitive metal island disposed on a printed circuit board (PCB). Extrinsic clock skew is controlled through the use of wide, relatively high-capacitance traces of matched length and disposed on a single, common signal layer of the PCB, each leading to a respective receiver circuit and terminated identically. Clock jitter is controlled by electrically isolating a region of the PCB, disposing the clock driver in the region in such a way as to minimize noise, and providing quiet local power and ground to the region.

12 Claims, 6 Drawing Sheets

METHOD AND APPARATUS FOR CLOCK UNCERTAINTY MINIMIZATION

CROSS-REFERENCE TO RELATED APPLICATION

This a divisional of U.S. patent application Ser. No. 09/106,823, filed Jun. 29, 1998, now U.S. Pat. No. 6,052,012. This is also related to U.S. patent application Ser. No. 09/360,072 which is a division of U.S. Pat. No. 6,052,012 and U.S. patent application Ser. No. 09/439,077 which is a continuation of U.S. Pat. No. 6,052,012.

BACKGROUND OF THE INVENTION

1. Field of the Invention

The present invention relates to the minimization of clock uncertainty in high-performance digital circuitry. More specifically, the present invention relates to a method and apparatus for minimizing clock uncertainties due to skew and jitter.

2. The Background

In modern, high-performance digital circuits, precise tiring is of paramount importance. Slight clock uncertainties can cause momentary, spurious signals which can become magnified as they propagate through a complex digital circuit, often with unpredictable and disastrous results. If such uncertainties are not carefully controlled, they can quickly lead to catastrophic failure or inoperativeness of the device.

Tiny differences in clock outputs and propagation delays across the complex web of conducting pathways, or traces, on a printed circuit board, or PCB, are one source of timing uncertainty. This is a problem well-known to those of ordinary skill in the art, and is referred to as "clock skew." Clock skew places limitations on the speed and performance of high-speed digital devices and must be taken into account in the design of such devices.

Broadly speaking, clock skew can be resolved into two basic components. The first of these, intrinsic skew (variously known as "output-to-output" or "pin-to-pin" skew), is a measure of the delay between the clock outputs in a single multi-line clock driver. The second component, extrinsic skew (also referred to as "trace-to-trace" skew), measures the delay arising from the propagation of signals across the various traces of a printed circuit board leading to respective components which use the clock signals as inputs. Standard schemes to minimize clock uncertainty typically deal with each of these components in turn.

The problem of intrinsic clock skew can be partially alleviated simply through the use of standard low-skew multi-line clock drivers, such as the Motorola MPC972. These devices typically rely on PLL technology and provide a plurality of synchronized, same-frequency outputs, usually with frequencies on the order of 100 MHz, and come with manufacturing specifications that guarantee a worst-case output-to-output skew of no more than 500 ps. The outputs can then be used to drive various clocked circuits in relative synchronicity, according to a clock distribution scheme, or tree. Many high-speed applications, however, demand skew levels below 100 ps. Standard methods to reduce skew to such low levels include the use of special, ultra-low skew clock drivers and active skew-correction circuitry, but such methods are often quite expensive to implement, particularly in devices that require the use of many such clock drivers.

In addition to the intrinsic skew originating from the outputs of the multi-line clock driver itself, there is the problem of extrinsic, or trace-to-trace clock skew originating from slight differences in the delay times across the traces of a printed circuit board. In high-speed digital applications, designers must take into account the fact that each trace is in reality a transmission line with a finite propagation velocity that depends on the physical and geometric characteristics of the trace, and, in particular, varies measurably with the signal layer on which the trace is disposed. In other words, even if skew is well within design margins when clock pulses depart from the base of a clock tree, there is no guarantee that the same will be true when the pulses arrive at the "leaves," or components of the tree.

The delays caused by these so-called "transmission-line" effects depend on a multiplicity of factors. Slight variations in trace length and propagation velocity, differences in the nominal impedances of the various driven loads, and termination effects, such as reflection from the trace ends and ringing, can all conspire to push clock skew, as received by the various clocked loads, beyond acceptable design parameters.

Some of these problems can be partially alleviated by careful observation of standard design rules, well-known to those of ordinary skill in the art. These rules include matching the lengths of each trace, impedance-matching to minimize reflection from the trace terminations, balancing of loads, and employing a consistent termination strategy at each level of the clock hierarchy. In reality, however, it is quite difficult to lower skew to 100 ps or less with such standard methods. For example, for a typical trace with a characteristic impedance of 75 Ω, even tiny manufacturing variances in the input capacitances of different loads, on the order of only a few picofarads, are sufficient to generate more than 100 ps of skew.

Still another source of clock uncertainty is the variation in the output of the clock driver from pulse to pulse. This is well-known to those of ordinary skill in the art, and is referred to as "jitter." Jitter is caused, for instance, when noise from the rest of the circuit board, or from the device power supply, modulates the output of the clock driver, causing uncertainty in the time of threshold voltage crossing for an output pulse. Lowering the overall noise level of the board, however, is impractical. In a typical application with pulse rise and fall rates on the order of 1 V/ns, noise levels on the order of only 100 mV can lead to clock uncertainties due to jitter on the order of 100 ps. Furthermore, the operation of clock driver itself can be a source of jitter-causing noise.

Accordingly, it is an object and advantage of the present invention to enhance the performance of clocked digital circuits by drastically reducing overall timing uncertainties due to clock skew and jitter to levels below 250 ps, at minimal cost and using only standard multi-line clock drivers, such as the Motorola MPC972 PLL.

Another object and advantage of the present invention is to effectively eliminate timing uncertainties due to the intrinsic, or output-to-output, clock skew from a standard multi-line clock driver used to drive a plurality of clocked digital circuits.

Yet another object and advantage of the present invention is to reduce timing uncertainties due to extrinsic, or trace-to-trace, clock skew to levels well below 100 ps for a standard clock driver disposed on a PCB, using only simple electrical components and flexible, easily implementable design rules.

Yet another object and advantage of the present invention is to reduce timing uncertainties due to clock jitter to levels well below 100 ps for a standard clock driver disposed on a PCB, using only simple electrical components and flexible, easily implementable design rules.

These and many other objects and advantages of the present invention will become apparent to those of ordinary skill in the art from a consideration of the drawings and ensuing description of the invention.

BRIEF DESCRIPTION OF THE INVENTION

The purpose of the present invention is to provide a method and apparatus for drastically lowering clock uncertainties in digital circuit applications simply, at minimal cost, and using only standard clock drivers. This would allow for faster and cheaper digital circuits that provide increased timing margins and are also easier to design.

The method includes the steps of minimizing clock uncertainty by minimizing clock skew and by minimizing clock jitter.

Clock skew is minimized by linking the same-frequency outputs of a multi-line clock driver onto a common metal island disposed on a printed circuit board, laying out a plurality of wide, relatively high-capacitance traces, of roughly equal lengths, from the metal island to respective ones of a plurality of clocked digital circuits, laying out the traces on a single signal layer of the printed circuit board, and terminating the traces identically.

Clock jitter is minimized by electrically isolating a region in a printed circuit board from the rest of the circuit board, disposing a clock driver in the isolated region, providing a local quiet ground to the isolated region, providing a local power from a separate source to the isolated region, grounding the clock driver through the quiet ground, and supplying the clock driver with power from the separate source.

BRIEF DESCRIPTION OF THE FIGURES

FIG. 5A is a two-stage series power supply system. FIG. 5B is a parallel power supply system.

FIG. 8A is an oscilloscope trace showing the output from two 100 MHz pins of the Motorola MPC972 PLL clock driver, measured across a termination resistor. FIG. 8B is a blow up of FIG. 8A.

FIG. 9A is an oscilloscope trace showing the superimposed 100 MHz pulses from the output of a 100 mHz Motorola MPC972 PLL. FIG. 9B is a blow-up of FIG. 9A with a superimposed histogram showing the statistical variation between pulses over the duration of the measurement.

DETAILED DESCRIPTION OF THE INVENTION

Those of ordinary skill in the art will realize that the following description of the present invention is illustrative only and is not intended to be in any way limiting. Other embodiments of the invention will readily suggest themselves to such skilled persons from an examination of the within disclosure.

Figure 1:
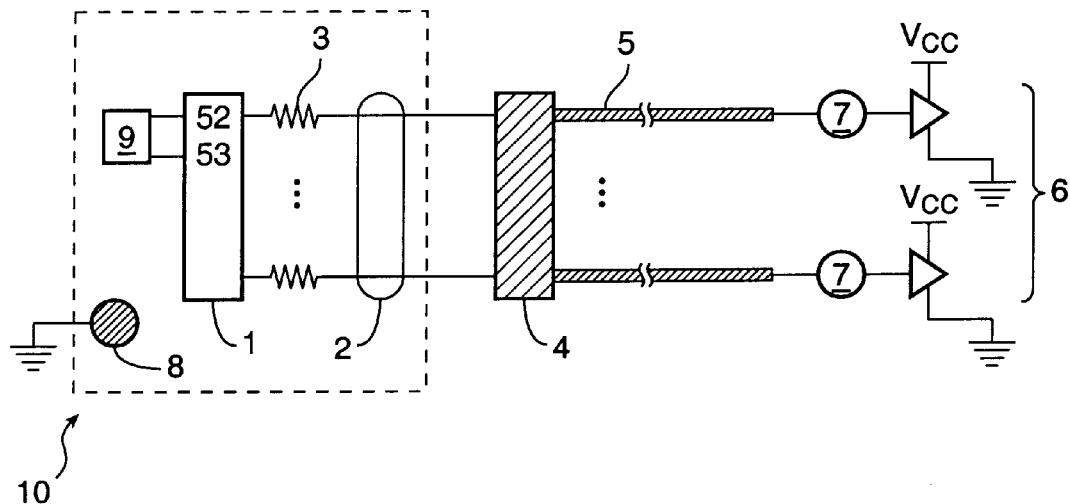
FIG. 1 is a schematic diagram depicting a system for minimizing clock skew and jitter for a standard, multi-line clock driver in accordance with the presently preferred embodiment of the present invention.

In the presently preferred embodiment of the invention, depicted schematically in FIG. 1, skew is minimized by linking, or ganging, the same-frequency outputs 2 of a multi-line clock driver 1 together onto a common metal island 4 of a printed circuit board. A plurality of wide (approximately 10 mil), low-impedance (approximately 40 Ω) traces 5 fan out from the metal island 4, each leading to a respective one of a plurality of clocked receiver circuits 6. Each trace is terminated according to an identical termination scheme 7. Jitter is minimized by disposing the clock driver 1 within an electrically isolated region of the board 10. A quiet local power supply 9 and a quiet local ground 8 are provided within the region and are implemented in a manner that minimizes the effect of noise from the clock driver 1 itself. This creates an extremely quiet operating environment for the clock driver 1, where voltage fluctuations from noise are kept well below 100 mV, peak-to-peak.

Ganging the clock outputs 2 together is a simple and essentially costless way to create, in effect, a single, power-amplified source of clock pulses, capable of driving a plurality of receiver circuits. The metal island itself can be rendered in copper at essentially no cost during the PCB layout stage. Since each receiver circuit now sees signals from the same metal island 4, ganging completely eliminates the problem of intrinsic output-to-output skew from the multi-line clock driver 1. The number of same-frequency clock outputs ganged on the island is chosen so that there is no significant degradation in the form of output pulses. The precise number can be chosen depending on the particular application.

Intrinsic skew, however, is only one source of overall clock skew, and simply ganging the same frequency outputs of the clock driver 1 together is insufficient to lower overall skew to levels below 100 ps. To achieve such great timing precision, extrinsic skew must also be tightly controlled. This is achieved in the present invention through the use of a variety of flexible and easily implementable design rules.

Printed circuit boards are usually organized in layers, and communication between layers is provided with special transverse conducting paths known as "vias." Since the propagation velocity along a trace, and hence the signal delay time associated with the trace, can vary depending on which signal layer of the board the trace is disposed (because of manufacturing differences which differentially affect the characteristics of each signal layer), the traces fanning out from the metal island are laid out on a single, common signal layer of the printed circuit board. This scheme works to minimize extrinsic skew originating from the different operating conditions on each layer of the board. Such conditions include the propagation velocity of signals along traces, as well as noise from other parts of the circuit board. Any condition specific in some way to the signal layer will be borne equally by each of the traces and its effect on the relative skew between the traces will be therefore minimized.

Wide traces 5 with relatively high intrinsic capacitance help counteract extrinsic skew originating from small manufacturing variances in the capacitance of the various loads 6. These variances are typically on the order of about 3 pF to about 8 pF. The relatively high capacitance of the traces 5 translates into a correspondingly lower characteristic impedance; in the presently preferred embodiment of the invention, the characteristic impedance of the 10 mil traces is on the order of 40 Ω. Laying the traces 5 out in parallel from the metal island 4 reduces the impedance as seen by the clock driver 1 even further; for instance, with four parallel traces, each with characteristic impedances of 40 Ω each, the effective impedance seen by the driver 1 is only 10 Ω.

Figure 2A:
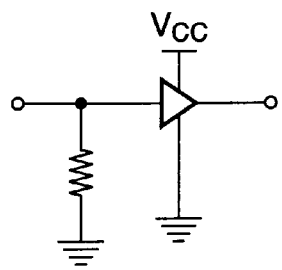
FIGS. 2A and 2B are a pair of electrical schematic diagrams depicting a pair of common trace-termination schemes in accordance with the presently preferred embodiment of the present invention.
Figure 2B:
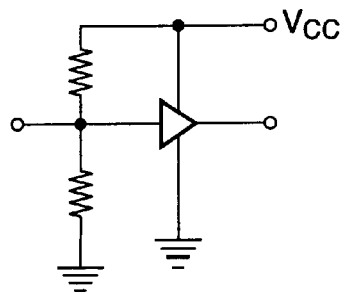

Standard design rules for high-speed digital circuits usually call for impedance-matching at the trace ends. According to the present invention, however, each trace is over-terminated with effective end-resistance values significantly higher than the characteristic impedance of the traces (approximately 80 Ω), in order to prevent excessive current from the low impedance of the wide traces. A consistent termination scheme 7 is employed for each trace. FIG. 2 shows two common termination strategies. FIG. 2(*a*) shows a simple parallel termination scheme. FIG. 2(*b*) shows a variation of the simple parallel termination scheme, known as a Thevenin termination scheme. The Thevenin scheme is used in the presently preferred embodiment of the invention. As will be apparent to those of ordinary skill on the art, however, the particular termination strategy chosen will be limited only by the desired application.

Figure 3:
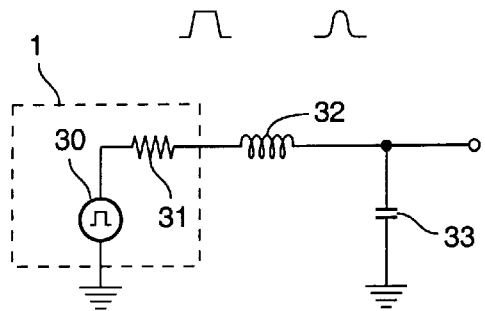
FIG. 3 is an electrical schematic diagram of an L-C filter in accordance with the presently preferred embodiment of the present invention.

In order to minimize reflection and ringing effects from the drastically over-terminated traces, the clock outputs 2 are first passed through a filter. The filter takes advantage of the intrinsic capacitance of the metal island 4, and is created by inserting inductive elements in the form of ultra-low impedance, or so-called "zero-ohm", resistors 3 having small parasitic inductance on the order of 2 nH between the output of each same-frequency clock of the multi-line clock driver 1 and the metal island 4. The dimensions of the metal island 4 are chosen to provide sufficient capacitance (approximately 100 pF) to create an L-C filter that reduces the high-frequency components of the output signals, and rounds the pulse edges. A schematic diagram of the equivalent filter is depicted in FIG. 3. Here, the clock driver 1 is greatly simplified and modeled as an ideal pulse generator 30 coupled to a linear resistance element 31. The zero-ohm resistors 3 are represented by an inductive element 32, and the capacitance of the island 4 is represented by a capacitor 33. Filtering and rounding the clock output pulses in this way compensates for the impedance mismatching at the over-terminated trace ends, but does not contribute significantly to overall skew.

Figure 4:
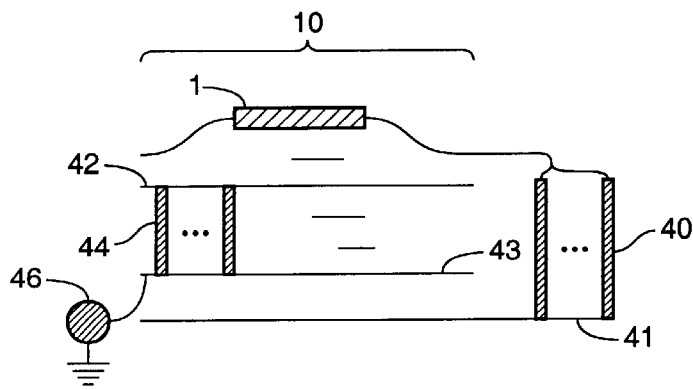
FIG. 4 is a schematic cross-sectional view of a printed circuit board in accordance with the presently preferred embodiment of the present invention.

Jitter due to electrical noise is minimized by operating the clock driver 1 in a quiet region 10 that is electrically isolated from the rest of the board. Within the region 10, voltage noise levels are kept well below 100 mV peak-to-peak. The region 10 is created through a special sectorial copper removal technique, well-known to those of ordinary skill in the art, known as "zoning" or "moating". A quiet local ground 8 and a quiet local power supply 9 are provided within the region 10. In the presently preferred embodiment of the invention, the ground 8 and the power supply 9 are arranged on multiple layers of the PCB, as illustrated FIG. 4, which shows the PCB schematically in cross-section. The local ground 8 is implemented as a quiet surface ground plane 42 disposed directly beneath the clock 1. The surface ground plane 42 is disposed near the clock driver 1 and acts as a shield to diminish the clock's efficiency as an antenna and further reduce noise. The ground plane 42 is coupled to an inner ground plane 43 with a plurality of vias 44, and the inner ground plane 43 is, in turn, coupled to the a chassis ground 46 disposed on the PCB. The chassis is chosen because it is the quietest readily available ground reference. In addition, the entire region 10 is disposed as close as possible physically to the chassis ground 46.

Each of the plurality of vias 44 carries a certain amount of parasitic inductance that can lead to unwanted noise, since any fluctuation in current across an inductive element produces a noise voltage. Such current fluctuations can arise, for instance, from radiation from the operation of the clock driver 1 itself. In order to counteract this effect, a plurality of vias 44 linking the surface and inner grounds are implemented in parallel. By dividing the current across several vias, the current fluctuations across any particular via, and the resulting noise induced by these fluctuations, are diminished proportionately. The total effective inductance is therefore equal to only a small fraction of the parasitic inductance of each individual via. In the presently preferred embodiment of the invention, this effective inductance is well below 1 nH.

Local power is delivered to the region 10 through an inner power layer 41. Again, the inner power layer 41 is linked to the surface of the PCB with a plurality of vias 40 having a total effective inductance well below 1 nH. Because any circuit loop can act as a receiving antenna whose sensitivity to noise-inducing electromagnetic fluctuations tends to increase with increasing loop area, in the presently preferred embodiment of the invention the inner power layer 41 is disposed on a layer near that of the inner ground plane 43. Since the surface ground 42 is disposed near the clock driver 1, the result is a geometric arrangement of ground and power layers that diminishes the loop area of the circuit and therefore decreases its sensitivity to noise-inducing radiation from both the board and the clock driver 1.

Figure 5A:
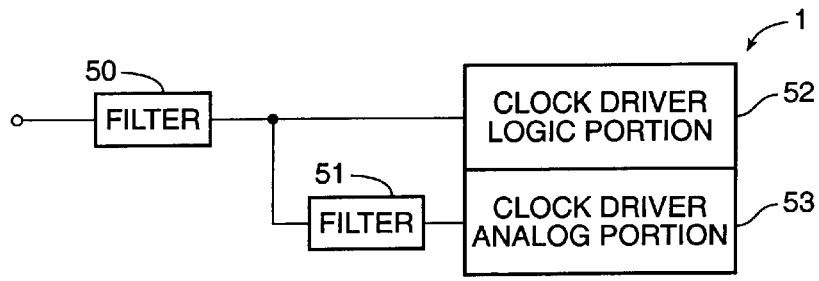
FIGS. 5A and 5B is a pair of block diagrams depicting a pair of power supply systems in accordance with the presently preferred embodiment of the present invention.
Figure 5B:
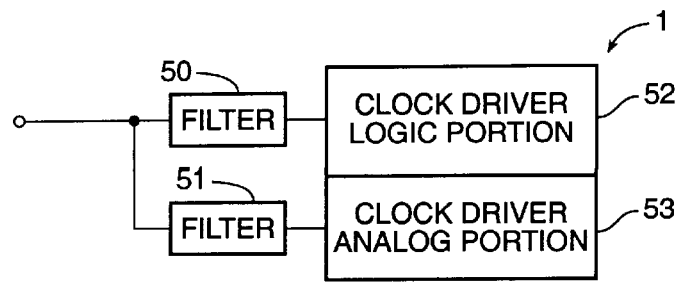
Figure 6:
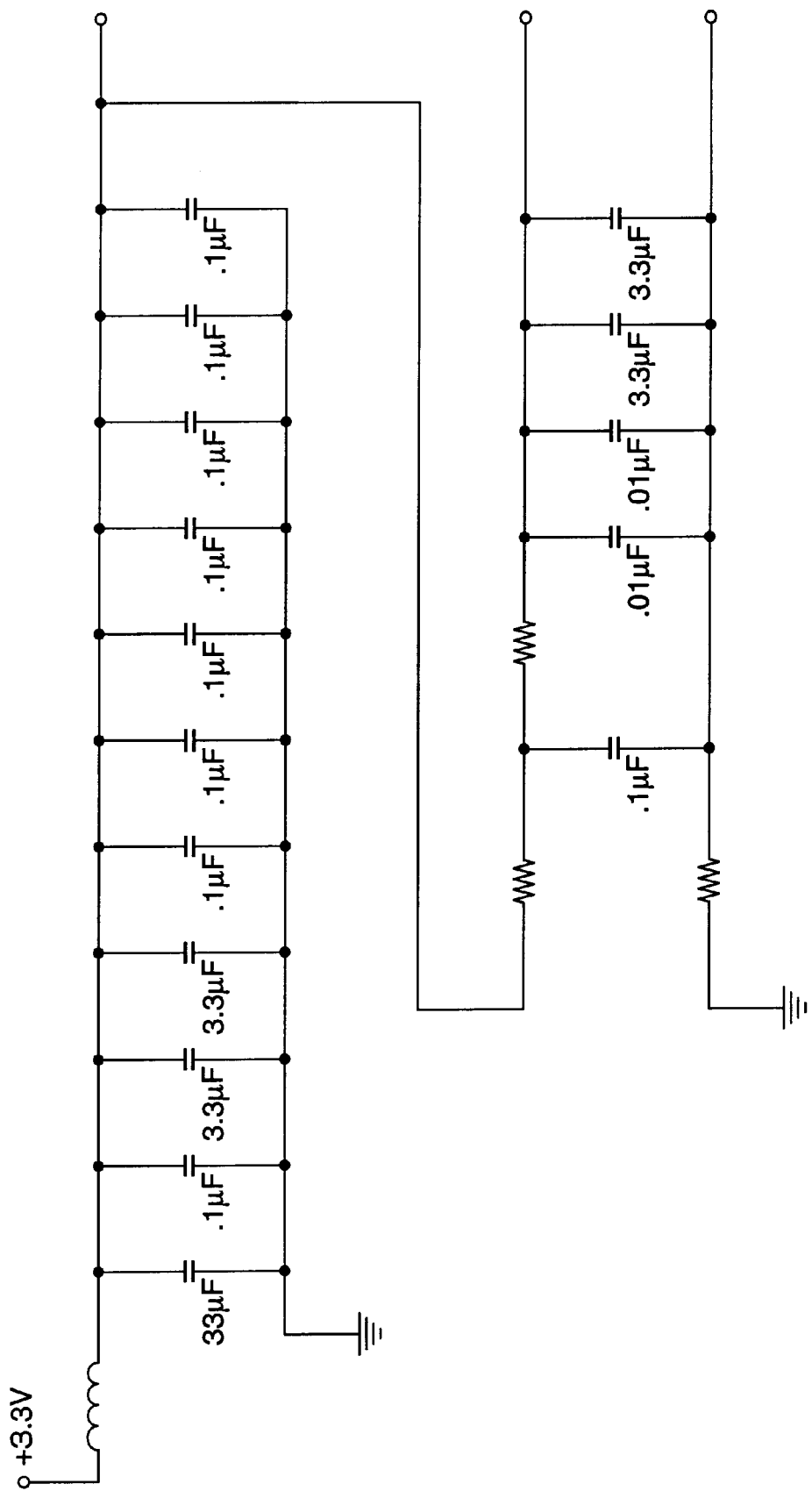
FIG. 6 is an electrical schematic diagram of a two-stage R-C filter in accordance with the presently preferred embodiment of the present invention.

In the presently preferred embodiment of the invention, the power supply step actually occurs in two stages, as shown schematically in FIG. 5(*a*). First, power is decoupled and filtered from the general power supply of the board to provide a first stage of power 41. Power from the first stage is used to power a logic portion 52 of the clock driver 1. The power from the first stage is then filtered again 51, and power from this second filtering stage is used to power an analog portion of the clock 53. The filters 50, 51 are preferably realized in a conventional manner with a multi-stage capacitor scheme 60 having a total parasitic inductance of less than 11 nH. FIG. 6 is an electrical schematic that illustrates the scheme used in the presently preferred embodiment of the invention. It is also possible to filter power to the logic and analog portions of the clock driver separately, as shown schematically in FIG. 5(*b*).

Figure 7:
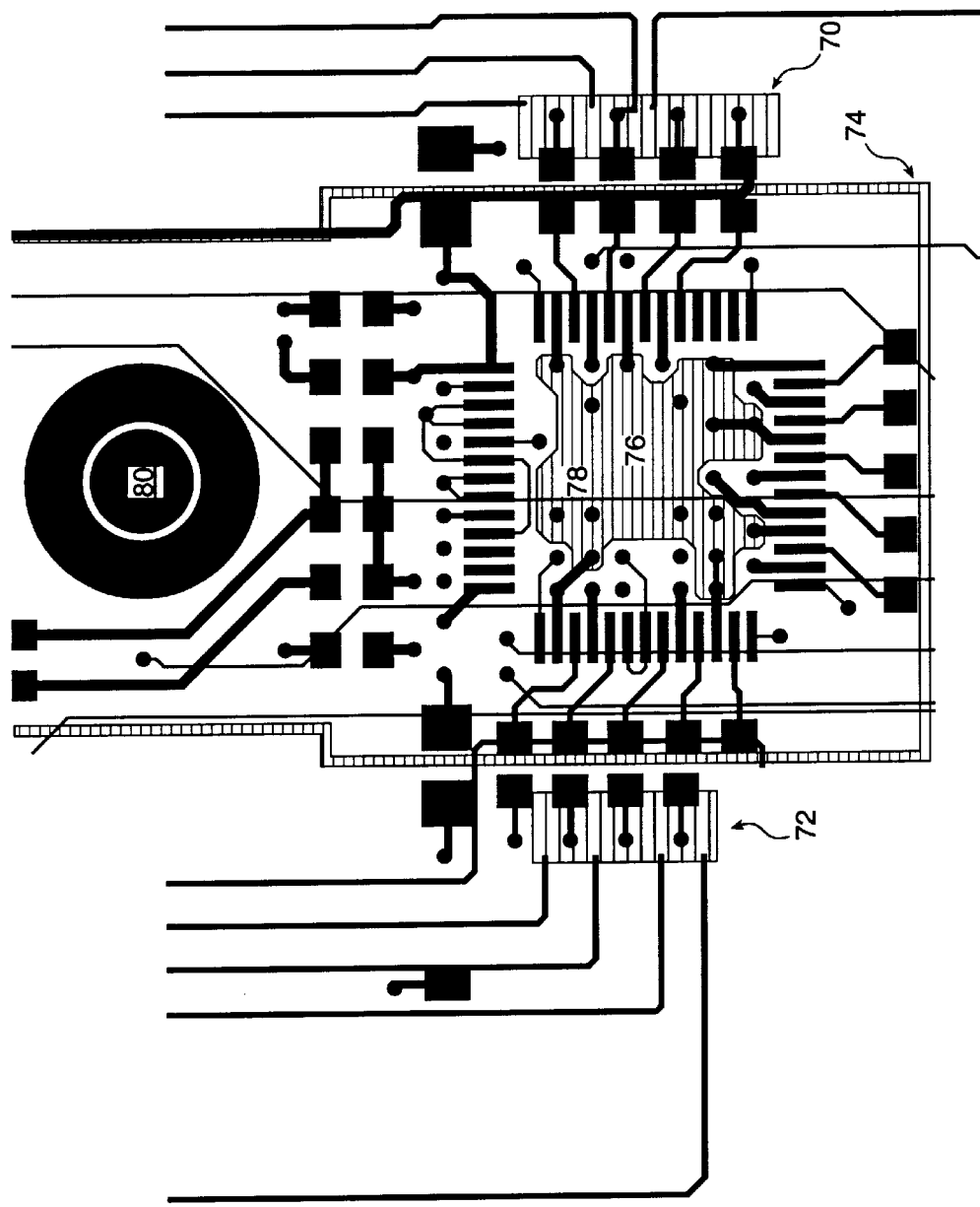
FIG. 7 is a portion of a PCB design layout in accordance with the presently preferred embodiment of the present invention.

The actual PCB surface layout of the presently preferred embodiment of the invention is shown in FIG. 7. Here there are two metal islands 70, 72 on opposite sides of a moat 74. The clock driver, in this case a Motorola MPC972 PLL, sits just above the surface ground 76. Vias 78 lead from the surface ground 76 to an inner ground disposed on a layer within the PCB (not shown). The large, circular chassis ground 80 is also quite visible.

Figure 8A:
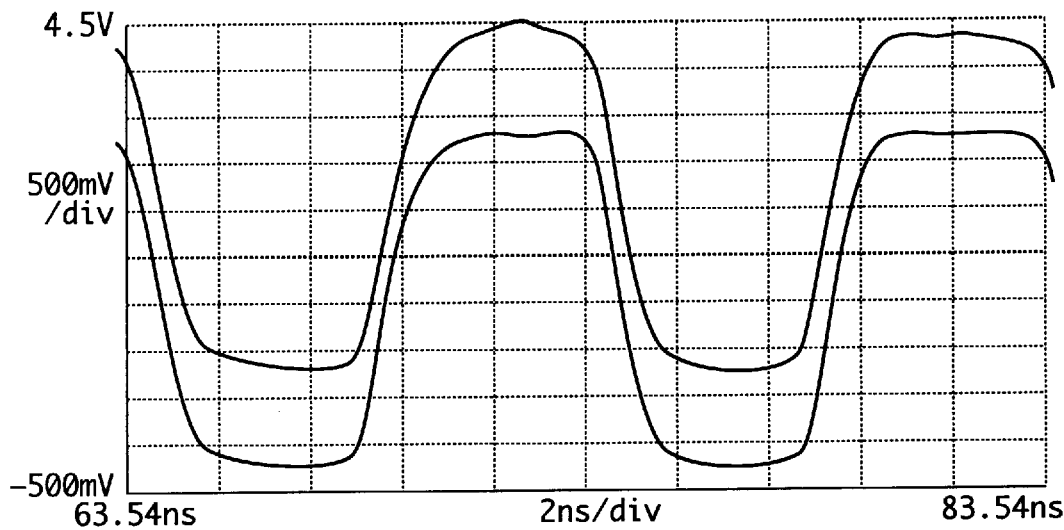
FIGS. 8A and 8B is an oscilloscope measurement of clock skew in accordance with the presently preferred embodiment of the invention.
Figure 8B:
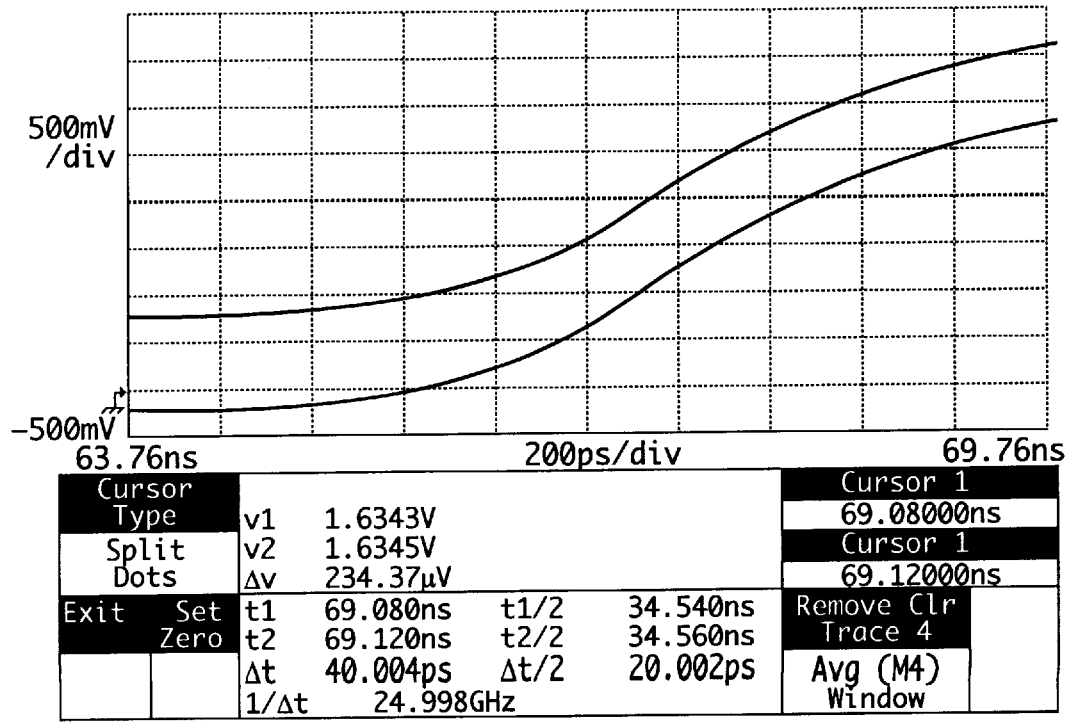
Figure 9A:
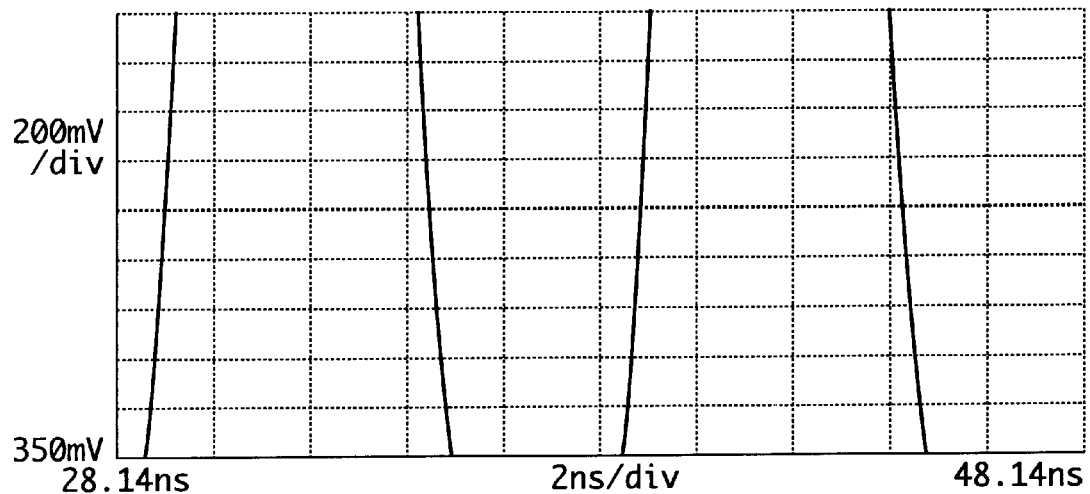
FIGS. 9A and 9B is an oscilloscope measurement of clock jitter in accordance with the presently preferred embodiment of the invention.
Figure 9B:
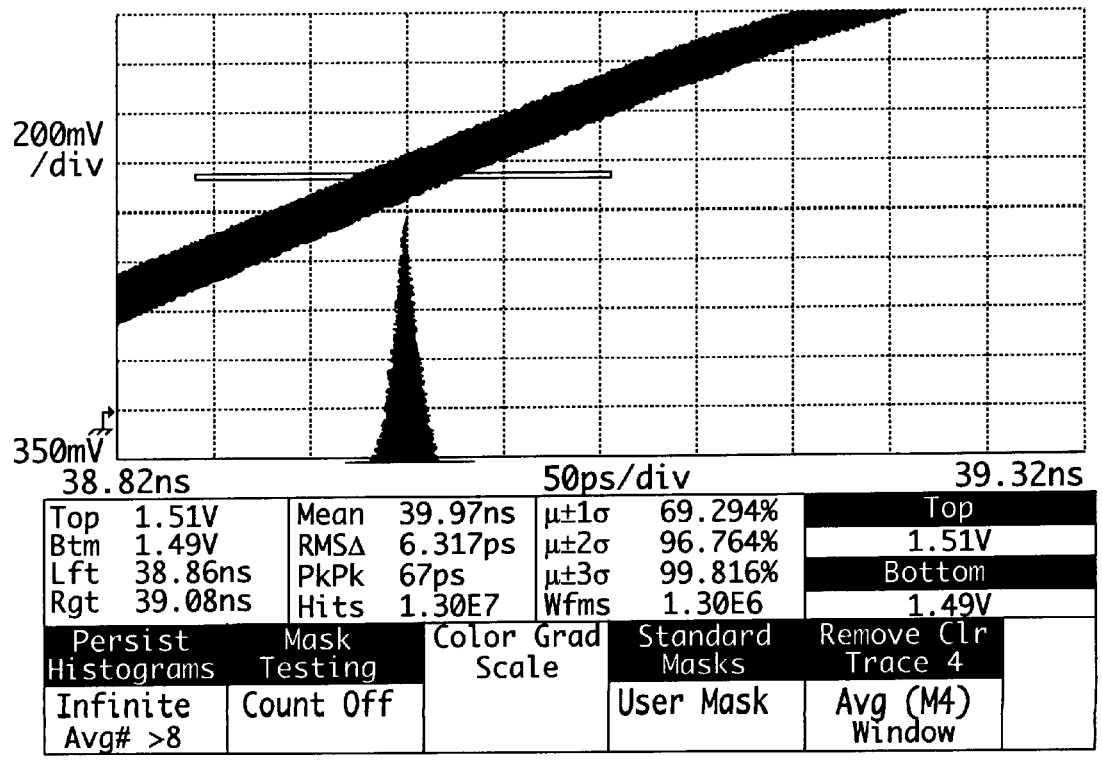

Extensive measurements of the presently preferred embodiment of the invention indicate that overall skew levels from a standard clock, such as a Motorola MPC972 PLL, with a manufacturer-provided intrinsic skew specification of 500 ps, can be reduced well below 100 ps using the methods of the invention. FIG. 8 shows one such measurement, performed using a Tektronix 11801B oscilloscope operating in enhanced accuracy mode. FIG. 8(a) shows the output measured at termination points 7 from two of the 100 MHz clock outputs of the MPC972 used to drive a pair of ASIC loads (the outputs have been voltage-shifted to make the diagram clearer). FIG. 8(b) is a ten-fold blow-up of FIG. 8(a), showing the rise of a pair of pulses. Measurements show that skew levels are just over 40 ps, an order-of-magnitude improvement. Measurements of clock jitter, shown in FIG. 9, are equally dramatic. FIG. 9(a) shows pulses from a 100 MHz clock output of the MPC972, superimposed over a 21-hour period, or over 7 trillion cycles. FIG. 9(b) is a 40-fold blow-up of a portion of FIG. 9(a), with a histogram underneath that shows the statistical variation in the pulses over the period of the experiment. The histogram width indicates a variation on the order of only 67 ps. These results were achieved using the presently preferred embodiment of the present invention at virtually no extra cost, because everything was be done at the PCB layout stage or through the use of cheap, simple electrical components.

Alternative Embodiments

Although illustrative presently preferred embodiments and applications of this invention are shown and described herein, many variations and modifications are possible which remain within the concept, scope, and spirit of the invention, and these variations would become clear to those of skill in the art after perusal of this application. The invention, therefore, is not intended to be limited except in the spirit of the appended claims.

What is claimed is:

1. A method of minimizing clock jitter in a clock driver disposed on a printed circuit board, said method comprising:

providing a clock driver;

electrically isolating a region on the printed circuit board through zoning or moating;

placing said clock driver in said region;

providing a local ground having less than 100 mV, peak-to-peak, of noise to said region;

grounding said clock driver to said local ground;

providing a local power source having less than 100 mV, peak-to-peak, of noise to said region; and supplying said clock driver with power from said local power source;

wherein said local power source is obtained from a general power supply of said board by filtering said general power supply with a multi-stage decoupling capacitor scheme having less than 1 nH of total parasitic inductance.

2. The method of claim 1, wherein said clock driver is a PLL.

3. A method of minimizing clock jitter in a clock driver disposed on a printed circuit board, said method comprising:

providing a clock driver;

electrically isolating a region on the printed circuit board through zoning or moating;

placing said clock driver in said region;

providing a local ground having less than 100 mV, peak-to-peak, of noise to said region;

grounding said clock driver to said local ground;

providing a local power source having less than 100 mV peak-to-peak, of noise to said region; and supplying said clock driver with power from said local power source;

wherein said local power source is disposed on a layer distinct from the layer on which said clock driver is disposed, and wherein said supplying said clock driver further comprises:

delivering power from said local power source to said clock driver with a plurality vias having a total effective inductance of less than 1 nH.

4. The method of claim 3, wherein said grounding said clock driver further includes:

providing a surface ground plane, disposed on the surface of said printed circuit board and near to and beneath said clock driver;

providing an inner ground plane, disposed on a layer of said printed circuit board near the layer on which said local power source is disposed;

providing a chassis ground disposed on said printed circuit board in close physical proximity to said isolated region;

linking said surface ground plane and said inner ground plane with a plurality of vias having a total effective inductance of less than 1 nH; and linking said inner ground plane and said chassis ground of said printed circuit board.

5. A method of minimizing clock jitter in a clock driver disposed on a printed circuit board, said method comprising:

providing a clock driver;

electrically isolating a region on the printed circuit board through zoning or moating;

placing said clock driver in said region;

providing a local ground having less than 100 mV, peak-to-peak of noise to said region;

grounding said clock driver to said local ground;

providing a local power source having less than 100 mV peak-to-peak of noise to said region; and supplying said clock driver with power from said local power source;

wherein said clock driver has separate analog and logic power input portions, and wherein said supplying said clock driver further comprises:

supplying power to said logic power input portion of said clock driver with power from said local power source;

filtering said local power source, obtaining a second stage of filtered power; and supplying power to said analog power input portion of said clock driver with power from said second stage.

6. A method of minimizing clock jitter in a clock driver disposed on a printed circuit board, said method comprising:

providing a clock driver;

electrically isolating a region on the printed circuit board through zoning or moating;

placing said clock driver in said region;

providing a local ground having less than 100 mV, peak-to-peak, of noise to said region;

grounding said clock driver to said local ground;

providing a local power source having less than 100 mV, peak-to-peak, of noise to said region; and supplying said clock driver with power from said local power source;

wherein said clock driver has separate analog and logic power input portions, and wherein said providing a local power source further comprises:
  providing two local power sources to said region, decoupled from one another; and
  said supplying power step further comprises the substep of:
    supplying power to said analog and logic power input portions of said clock driver from a respective one of said local power sources.

7. An ultra-low jitter clock driver disposed on a printed circuit board, said clock driver comprising:
  an electrically isolated region on said printed circuit board;
  a standard clock driver disposed in said electrically isolated region;
  a local ground having less than 100 mV, peak-to-peak, of noise; and
  a local power source having less than 100 mV, peak-to-peak, of noise, said local power source supplying power to said clock driver;
  wherein said local power source is obtained from a general power supply of said board with multi-stage decoupling capacitor scheme having less than 1 nH of total parasitic impedance.

8. The apparatus of claim 7, wherein said clock driver is a PLL.

9. An ultra-low jitter clock driver disposed on a printed circuit board, said clock driver comprising:
  an electrically isolated region on said printed circuit board;
  a standard clock driver disposed in said electrically isolated region;
  a local ground having less than 100 mV, peak-to-peak, of noise; and
  a local power source having less than 100 mV, peak-to-peak, of noise, said local power source supplying power to said clock driver;
  wherein said local power source is disposed on a layer distinct from the layer on which said clock driver is disposed and further comprising a plurality of vias having a total effective inductance of less than 1 nH, delivering power from said local power source to said clock driver.

10. The apparatus of claim 9, further comprising:
  a surface ground plane disposed on the surface of said printed circuit board near to and beneath said clock driver;
  an inner ground plane disposed on a layer of said printed circuit board near the layer on which said local power source is disposed;
  a chassis ground disposed on said printed circuit board in close physical proximity to said isolated region;
  a conductive path linking said inner and chassis grounds; and
  a plurality of vias having total equivalent inductance of less than 1 nH, linking said surface and inner grounds.

11. An ultra-low jitter clock driver disposed on a printed circuit board, said clock driver comprising:
  an electrically isolated region on said printed circuit board;
  a standard clock driver disposed in said electrically isolated region;
  a local ground having less than 100 mV, peak-to-peak, of noise; and
  a local power source having less than 100 mV peak-to-peak, of noise, said local power source supplying power to said clock driver;
  wherein said clock driver has separate analog and logic power input portions and said local power source further comprises a primary power source, said primary power source supplying power to said logic power input portion of said clock driver; and
  a secondary power source obtained from filtering said primary source, said secondary power source supplying power to said analog power input portion of said clock driver.

12. An ultra-low jitter clock driver disposed on a printed circuit board, said clock driver comprising:
  an electrically isolated region on said printed circuit board;
  a standard clock driver disposed in said electrically isolated region;
  a local ground having less than 100 mV, peak-to-peak, of noise, and a local power source having less than 100 mV, peak-to-peak, of noise said local power source supplying power to said clock driver;
  wherein said clock driver has separate analog and logic power input portions and said local power source further comprises two local power sources, decoupled from one another and each providing power to a respective one of said analog and logic portions of said clock driver.

* * * * *

UNITED STATES PATENT AND TRADEMARK OFFICE
CERTIFICATE OF CORRECTION

PATENT NO. : 6,157,251
DATED : December 5, 2000
INVENTOR(S) : Sergio D. Camerlo

It is certified that error appears in the above-identified patent and that said Letters Patent is hereby corrected as shown below:

Column 1,
Lines 23-24 replace "tiring" with -- timing --.

Column 3,
Line 52 and 63, replace "is" with -- are --.

Column 4,
Line 3, replace "is with -- are --.

Column 6,
Line 55, replace "11" with -- 1 --.

Column 8,
Line 36, after "to-peak" insert -- , --.
Line 39, after "peak-to-peak" insert -- , --.

Column 10,
Line 37, after "noise" insert -- ; --.
Line 37, before "a" insert a new paragraph.
Line 38, after "noise" insert -- , --.

Signed and Sealed this

Twenty-sixth Day of March, 2002

*Attest:*

*Attesting Officer*

JAMES E. ROGAN
*Director of the United States Patent and Trademark Office*